(12) United States Patent
McIntosh

(10) Patent No.: US 6,496,348 B2
(45) Date of Patent: Dec. 17, 2002

(54) METHOD TO FORCE-BALANCE CAPACITIVE TRANSDUCERS

(76) Inventor: Robert B. McIntosh, 309 Vassar Rd., Alexandria, VA (US) 22314

( * ) Notice: Subject to any disclaimer, the term of this patent is extended or adjusted under 35 U.S.C. 154(b) by 1 day.

(21) Appl. No.: 09/866,351

(22) Filed: May 25, 2001

(65) Prior Publication Data

US 2001/0047689 A1 Dec. 6, 2001

Related U.S. Application Data

(63) Continuation-in-part of application No. 09/834,691, filed on Apr. 13, 2001, and a continuation-in-part of application No. 09/816,551, filed on Mar. 24, 2001, and a continuation-in-part of application No. 09/794,198, filed on Feb. 27, 2001, and a continuation-in-part of application No. 09/482,119, filed on Jan. 13, 2000, and a continuation-in-part of application No. 09/037,733, filed on Mar. 10, 1998, now Pat. No. 6,151,967.

(51) Int. Cl.$^7$ ............................................. G01P 15/215
(52) U.S. Cl. ........................................................ 361/115
(58) Field of Search .................................. 361/115, 277, 361/278, 280, 283.3, 283.4

(56) References Cited

U.S. PATENT DOCUMENTS 4,705,127 A  * 11/1987 Kunz
6,151,967 A  * 11/2000 McIntosh et al.

* cited by examiner

Primary Examiner—Edward H. Tso

(57) ABSTRACT

A method to maintain a movable electrode of a variable capacitor in fixed relationship with a stationary electrode by electrostatic force feedback when one capacitor electrode is grounded. The invention exploits the high quiescent capacitance and capacitance-load sensitivity of a variable-area capacitance transducer in combination with the advantage of controlling the flexible electrode with a low voltage compared to transducers with parallel-plate capacitors. The invention can be used to accurately control the position of a surface, stylus, inertial mass, valve, electrical contact, electrical component; or an optical component such as a mirror, lens, grating, filter, or holographic element.

16 Claims, 5 Drawing Sheets

METHOD TO FORCE-BALANCE CAPACITIVE TRANSDUCERS

CROSS-REFERENCE TO RELATED APPLICATIONS

This application is a continuation-in-part of application Ser. No. 09/482,119, Jan. 13, 2000, of application Ser. No. 09/037,733 of Mar. 10, 1998, now U.S. Pat. No. 6,151,967. The invention of the present application references art disclosed in continuation-in-part application Ser. No. 09/834,691, filed Apr. 13, 2001, Ser. No. 09/816,551, filed Mar. 24, 2001 and Ser. No. 09/794,198, filed Feb. 27, 2001, Ser. No. 09/482,119. Each disclosure of the foregoing applications are incorporated herein by reference. All of the applications are assigned to the same assignee as the present application.

GOVERNMENT RIGHTS

This invention was made with Government support under contract N00024-97-C-4157 from the Naval Sea Systems Command. The Government has certain rights to this invention

FIELD OF THE INVENTION

The present invention relates to force-balanced capacitive transducers including sensors and actuators. More specifically, it relates to a method to electrostatically force-balanced transducers that control the position of a surface, stylus, inertial mass, valve, electrical contact, electrical component; or an optical component such as a mirror, lens, grating, filter, or holographic element.

BACKGROUND OF THE INVENTION

Electrostatically, force-balanced, capacitive transducers maintain a compliant member, such as a beam, diaphragm, or bridge at a fixed position or predetermined gereratrix. One example is an accelerometer with capacitor electrodes that sense the displacement of an inertial mass suspended on a compliant member in relation to stationary support structure. A simple capacitive accelerometer measures a change in spacing between a capacitor electrode affixed to a surface of an inertial mass in close proximity to a cooperating capacitor electrode affixed to adjacent stationary structure. The two electrodes form a displacement sensing, parallel-plate capacitor with a capacitance value inversely proportional to the plate spacing. A force acting on the mass causes it to be displaced in proportion to the stiffness of the compliant member. When an unconstrained axis of the mass is orientated with the gravity gradient, it will deflect to an equilibrium or quiescent position where restoring forces due to the bending moment of the compliant member balance the force of acceleration acting on the mass. Motion of the support structure modulates the capacitor plate spacing due to the inertia of the mass. The corresponding change in capacitance is detected and transduced to provide a voltage proportional to the square root of a change in force acting on the mass.

The disadvantages of a simple capacitive accelerometer are: 1) a severely restricted dynamic measurement range due to a small capacitor gap, 2) a highly non-linear capacitance response with mass displacement, and 3) the requirement to dampen the response of the accelerometer at frequencies near the resonance of its spring-mass system. These disadvantages are avoided by operating a capacitive accelerometer in an electrostatic force-balanced feedback loop that maintains the inertial mass in a substantially fixed position under loading. An incremental displacement of the mass is capacitively detected, transduced, and amplified to provide a control voltage V across the capacitor plates to create an electrostatic force that restores the mass to its initial position. The electrostatic force $F_E$ applied to a electrode of a parallel-plate capacitor varies as $V^2/d$, where d is the effective plate spacing. Because the force $F_E$ is independent of the polarity of the control voltage V, the compliant member of a simple capacitive transducer is required to be electrostatically biased or mechanically preloaded to allow the accelerometer to sense a bi-directional force. Accelerometers, actuators, and other capacitive transducers with one, force balancing capacitor are defined here as single-side, force-balanced transducers.

In a similar manner, a simple electrostatic actuator applies an electrostatic force to an electrode affixed to a compliant member and/or attached payload to control the position of the member or payload. The payload can include a surface, stylus, inertial mass, valve, electrical contact, electrical component; or an optical component such as a mirror, lens, grating, filter, or holographic element. This method is of controlling the position of a compliant actuator member is equivalent to applying a voltage bias to the electrodes of a capacitive accelerometer to move its inertial mass to a new equilibrium position. For most actuator applications, a static force such as gravity is generally small compared to the applied electrostatic force and the reaction force of the compliant member and payload. A general disadvantage of a single-side, capacitive transducers (e.g., sensors and actuators) is that the effective spring constant and elastic restoring force of the preloaded compliant member is influenced by ageing and physical effects such as temperature.

Precision capacitive transducers use at least a pair of differential parallel-plate capacitors to sense and force-balance an inertial mass or to sense and position of a compliant member of an actuator. Planar electrodes are affixed to opposing surfaces of the mass and/or a compliant member which are located in close proximity to cooperating planar electrodes affixed to adjacent stationary structure. The electrodes form one or more pairs of differential displacement sensing and force generating capacitors. When the mass of an accelerometer or payload of an actuator moves, the capacitance of one displacement sensing capacitor increases while that of a second capacitor decreases by substantially an equal amount. One advantage of a differential capacitive transducer is that the compliant member is not required to be preloaded for bi-directional force or position control. Another advantage is that an incremental capacitance change can be detected with a bridge circuit to minimize errors associated with unmatched electronic components and variations of supply and reference voltages.

Capacitance transducers with variable-gap, parallel-plate electrodes comprise a well-know and crowded art. The general disadvantage of prior-art capacitive transducers arise from the limitations imposed by parallel-plate capacitors: low-quiescent capacitance, low capacitance-load sensitivity, non-linear response, and the requirement to form and accurately maintain a precision structure with narrow electrode spacing. Variable-area capacitance transducers with a flexible electrode responsive to a physical effect are less known and less appreciated for their ability to provide an order of magnitude and greater increase in quiescence capacitance, capacitive-load sensitivity and linear dynamic range. Variable-area capacitors of U.S. Pat. No. 6,151,967 and those simply illustrated in FIGS. 1 and 2 are constructed by sandwiching a thin dielectric layer between a flexible electrode and a cooperating rigid electrode with a curved surface. The dielectric layer maintains a region of fixed capacitance spacing between mutually opposed areas of the rigid electrode and flexible electrode. The region of fixed capacitive spacing increases in extent as the flexible electrode deflects in response to a physical effect. The flexible electrode can be of electrically conducting material, or it can be comprise an electrically conducting layer affixed to at least one surface of a compliant member of dielectric material.

A variable-area capacitor with a flexible electrode comprising a compliant cantilever beam was described by Carter et al., "Measurement of Displacement and Strain by Capacity Methods", *Proc. J. Mech. Engr.* (152) 1945, pp. 215–221. The Carter transducer is generally of the design shown in FIG. 1. The use of this transducer as a displacement sensor was described by Frank, *Electrical Measurement Analysis*, McGraw-Hill, NY, 1959. Variable-area capacitors of U.S. Pat. No. 6,151,967, can be fabricated with flexible electrodes that include circular and rectilinear diaphragms. Transducers of this general design are in FIGS. 2 and 3.

The electrostatic deflection of a cantilever beam is a well known art that was recently reviewed by Legtenberg, et al., "Electrostatic Curved Electrode Actuators," *J. Micro Electro Mech Syst.* vol. 6, no. 3, 1997. The electrostatic deflection of circular and rectilinear diaphragms for a loudspeaker is an invention of Kyle, U.S. Pat. No. 1,644,387, Oct. 4, 1927. The Kyle invention is further discussed by Ford, et al., "The Kyle Condenser Loud Speaker," *P. Inst. Radio Engr.*, vol. 17, no. 7, 1929. Since this early work, a rich art has developed for electrostatically controlled actuators. None of the above cited prior-art references teach or suggest using a variable-area capacitor to develop an electrostatic force to position an actuator and the same capacitor to sense the position of the actuator for closed-loop electrostatic position control.

Accordingly, an object of the present invention is to provide a method to control the displacement of a flexible electrode of variable-area capacitive sensors and actuators by electrostatic force feedback.

The transducer of Cadwell, U.S. Pat. 4,584,885, and other early capacitive transducers used a first pair of capacitors to sense the displacement of a mass and a second pair of capacitors to apply an electrostatic force to the required side of the inertial mass to maintain it in a substantially fixed position. The disadvantage of this arrangement is that the surface area of the inertial mass is divided to accommodate two, smaller area capacitor electrodes. The accelerometer of Sherman et al., U.S. Pat. No. 5,540,095, and other force-balance capacitive transducers, are constructed with electronics that allow a single pair of capacitors to be used for both displacement sensing and force-balancing. The accelerometer of Suzuki et al., U.S. Pat. No. 5,095,752, and Yazdi, et al., U.S. Pat. No. 6,035,714, utilize only three electrodes to perform the displacement sensing and force balancing function. For these accelerometers, two differential capacitors are formed by affixing two planar electrodes on rigid support structure adjacent to opposite sides of an inertial mass. If inertial mass is of electrically conducting material, opposing surfaces of the mass serve as a common movable electrode for both capacitors. Alternately, electrodes affixed to opposing surfaces of the mass can be connected electrically in parallel to provide a common electrode. A disadvantage of prior art, differential capacitive transducers and associated capacitance detection electronics is that a common electrode cannot be electrically grounded. Grounding the common electrode minimizes the susceptibility of a transducer to electromagnetic interference and signal loss due to the attenuation (e.g., signal division) of stray capacitance. The total capacitance of 0.1 pF disclosed for the accelerometer of Sherman is representative of the values of other micromachined capacitive transducers. This value is small compared to the input capacitance of active electronics devices used for signal amplification.

Accordingly, still another object of the present invention is to provide a method that allows an electrode of a capacitive transducer controlled by electrostatic feedback to be grounded.

Variable-area capacitance sensors and actuators can be fabricated by many of the methods used to construct parallel-plate capacitive transducers with planar capacitor electrodes. U.S. Pat. No. 5,095,752, Suzaki et al., is one example of an accelerometer with two stationary planar electrodes and a common movable electrode. The movable electrode includes a thin section connected to an inertial mass that is bulk micromachined from single-crystal silicon. The invention of Sherman is a second example of a capacitive accelerometer with stationary planar electrodes and a common movable electrode. This accelerometer is surface micromachined by the well known steps of sacrificial layer etching. The profile and sidewalls of the movable electrode of polycrystalline silicon is formed over a sacrificial layer, typically of silicon dioxide ($SiO_2$) or oxynitride ($SiO_xN_x$) formed on a silicon substrate. The movable electrode is then released by etching the underlying silicon dioxide with hydrofluoric acid. U.S. Pat. No. 6,199,871 B1, Galvin et al., is a third example of a capacitive accelerometer with planar electrodes formed by surface micromachining of silicon using the method of multi-step, deep reactive ion etching (DRIE). The details of these and other micromachining methods are described Elwenspoek, et al., *Silicon Micromachining*, Cambridge University Press, Cambridge, UK, 1998.

Accordingly, another object of the present invention is to provide a method to control by electrostatic force feedback the displacement of a flexible electrode of a variable-area capacitor fabricated at least in part by the processing steps of bulk and surface micromachining.

The above cited capacitance sensors and actuators require a means to detect an incremental change of capacitance between at least two electrodes or a pair of differential capacitor electrodes. These inventions are representative of the many different capacitive transducers that can exploit the advantages of the capacitive detection circuits of U.S. pat. application Ser. Nos. 09/834,691 and 09/794,198. Specific advantages include: high DC stability, low impedance inputs, wide dynamic range, a linear output, the ability to ground a common capacitor electrode, and an option to provide a high-resolution digital signal output. The advantages of both circuit inventions are realized by variable capacitors with variable-area electrodes, variable-gap electrodes, and a combination of variable-area and variable gap electrodes. A further advantage of these preferred circuit inventions is that a bridge excitation signal applies a small periodic vibratory force to a flexible electrode to overcome and average any micro-frictional and stiction forces. The frequency of the vibratory force is higher than the frequencies of forces being detected or motion being controlled.

Accordingly, a further object of the present invention is to provide a method to control the displacement of a moveable electrode of a capacitive sensor or actuator using a capacitance detection circuit that provides current feedback to actively null a bridge network used to provide a voltage to electrostatic force balance the movable electrode.

SUMMARY OF THE INVENTION

The present invention is a method of providing electrostatic force feedback to maintain the displacement of a movable electrode of a variable capacitor in fixed relationship with a cooperating stationary electrode.

A preferred embodiment is a method to control a flexible electrode of a capacitive transducer by electrostatic force feedback comprising the steps of providing a capacitor with a flexible electrode and at least one cooperating stationary electrode; providing a capacitance detection circuit to detect a value of capacitance between the flexible and at least one stationary electrode; measuring and amplifying a change in capacitance of the capacitor to generate a feedback control voltage; and applying the feedback control voltage across the flexible and at least one stationary electrode to maintain the flexible electrode at a fixed position or predetermined generatrix. The compliant electrode can be a beam, diaphragm, or flexible bridge that supports a payload.

This invention exploits the advantages of variable-area capacitive sensors and actuators: high quiescent capacitance and capacitance-load sensitivity and the ability to displace a flexible electrode at low voltages compared to the voltage required to move a planar electrode of a parallel-plate capacitor. One aspect of the method of the present invention includes providing a capacitive transducer and a capacitance detection circuit that allows one of the two electrodes of a single-side variable capacitor to be grounded. For the preferred capacitance detection circuit of the present invention, one electrode of a variable capacitor is connected to a ground potential and a second terminal is connected to a first-side node of an actively nulled capacitive bridge. A reference capacitor is connected between a second-side node of the bridge and said ground potential. Alternately, capacitive changes can be detected with less accuracy using an actively nulled, half-bridge network connected to a reference voltage. For transducers with a pair of differential variable capacitors, one electrode of each capacitor is connected to opposing sides of an actively nulled bridge. Operational descriptions and optional designs are disclosed for full bridge and half bridge networks in U.S. patent application Ser. Nos. 09/482,119, 09/794,198, and 09/816,551.

DETAILED DESCRIPTION

Further objects and advantages of the present invention will become apparent from the following description. Well known techniques for processing semiconductor materials and fabricating micromachined devices are referred to without elaboration so not to obscure the description of the invention with unnecessary detail. All the drawings are schematic in nature and the features shown are not drawn to relative scale; like reference numbers designate similar parts or elements with similar functions.

Figure 1:
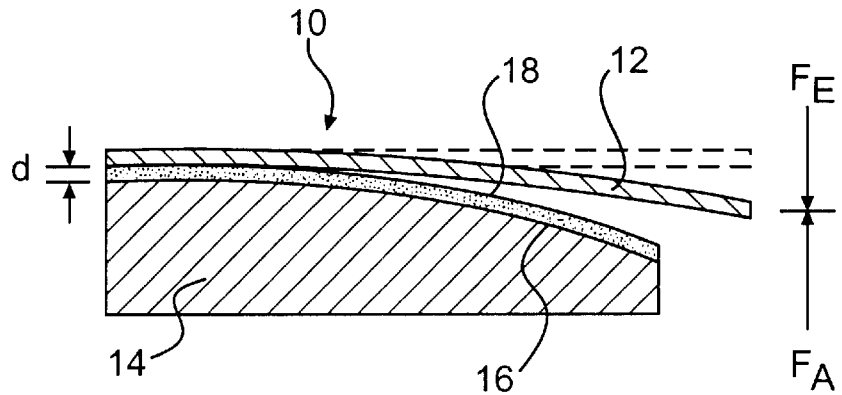
FIG. 1, is a simplified sectional illustration of a variable-area capacitor with a flexible electrode comprising a compliant cantilever beam.

FIG. 1, is a simplified sectional illustration a variable-area capacitor generally shown by reference numeral 10 with a flexible electrode 12 comprising a compliant cantilever beam that may include a payload. Flexible electrode 12 is affixed to an edge region of a cooperating rigid electrode 14 with a curved surface region 16 with a dielectric layer 18. Dielectric layer 18 electrically insulates and maintains a fixed capacitance spacing d between regions of mutually opposed areas of flexible electrode 12 and rigid electrode 14 as regions of said fixed capacitance spacing increases as flexible electrode 12 deflects in response to a difference between an applied stress $S_A$ and a counteracting electrostatic stress $S_E$. For purposes of illustration, the applied and electrostatic stresses are shown concentrated as forces $F_A$ and $F_E$ respectively. The curvature of surface region 16 of rigid electrode 14 facing flexible electrode 12 is selected to govern the rate of change in capacitance of capacitor 10 with deflection of electrode 12. A variable-area capacitor with substantially equivalent performance can be constructed by adhering dielectric layer 18 to flexible electrode 12.

Figure 2:
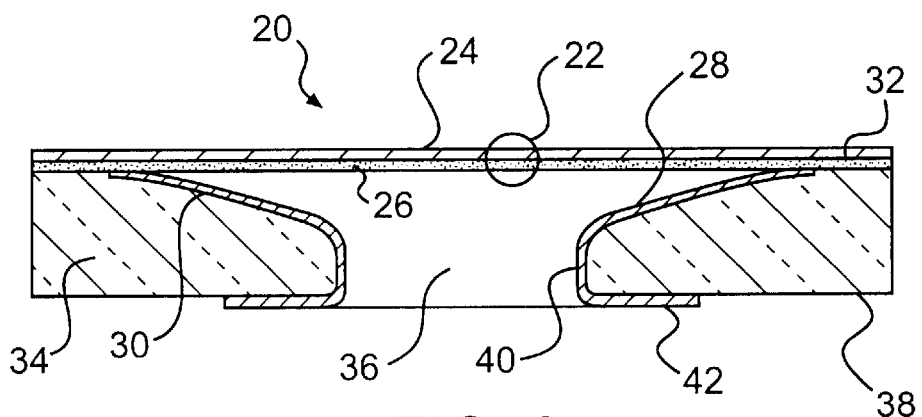
FIG. 2, is a sectional view of a variable-area capacitor with flexible electrode comprising a diaphragm.

FIG. 2, is a sectional view of a variable-area capacitor generally shown by reference numeral 20. For the construction illustrated, flexible electrode 22 comprises a metal layer 24 deposited on a diaphragm 26 of dielectric material. The rigid electrode of capacitor 20 comprises a second metal layer 28 deposited over a rotationally symmetric surface contoured region 30 formed over and in a planar surface 32 of a support member 34. A cavity 36 connects a central region of contoured region 30 to an opposing surface 38 of support member 34. Metal layer 28 is additionally formed on a wall 40 of cavity 36 and on surface 38 to provide a location 42 for bonding an electrical lead.

Figure 3:
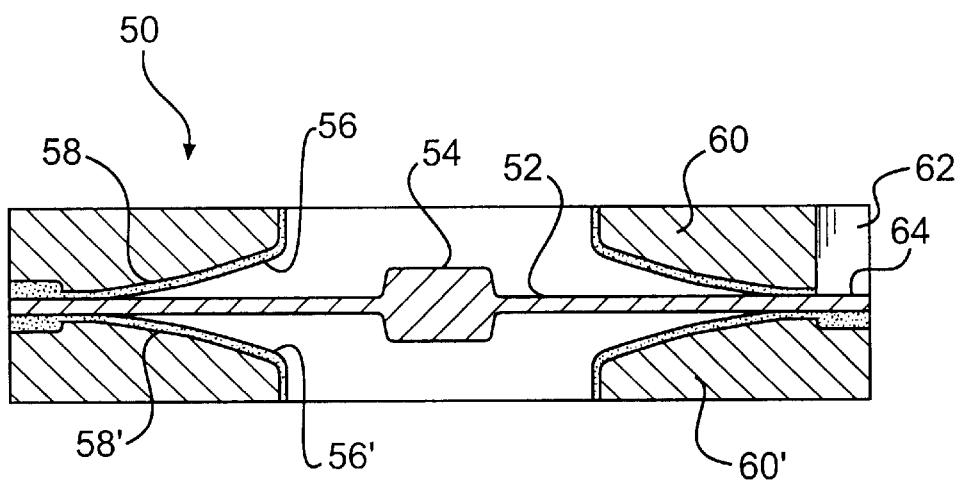
FIG. 3, is a sectional view of a differential variable-area capacitor with a flexible electrode that suspends a payload.

FIG. 3 is a sectional view of a differential variable-area capacitance transducer generally shown by reference numeral 50. Transducer 50 has a flexible electrode 52 that comprises a diaphragm or membrane of low resistivity material such as doped single-crystal silicon. Electrode 52 can include a central integral hub 56, or it can suspend an affixed inertial mass or other type of payload. Differential transducer 50 is constructed by sandwiching flexible electrode 52 between two dielectric layers 56 and 56' formed on opposing surface contoured regions 58 and 58' of rigid electrodes 60 and 60' respectively. A recessed groove 62 exposes a surface region 64 of flexible electrode 52 for bonding an electrical terminal.

Figures 4A, 4B:
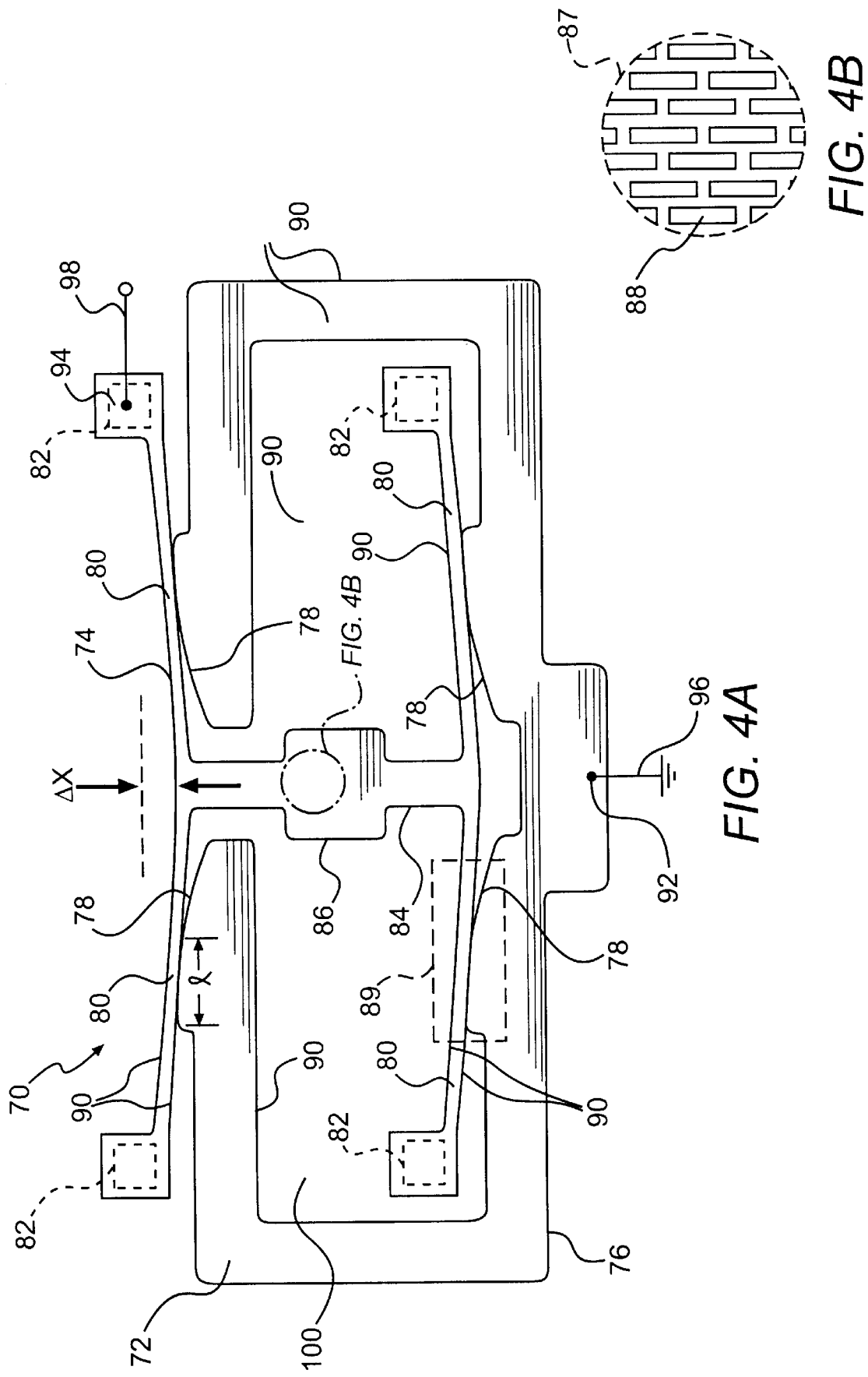
FIGS. 4A and 4B, are plan views of the electrode structure a variable-area capacitive transducer formed by surface micromachining.

FIG. 4A, is a plan view of the electrode structure of a variable-area capacitive transducer generally shown by reference numeral 70 micromachined in relief over a planar surface of a wafer of doped, low resistivity, single-crystal silicon. Electrode structure 70 comprises a stationary electrode member 72 and a movable electrode member 74 shown in FIG. 4 deflected a distance ΔX by an electrostatic force. Stationary electrode member 72 includes a frame 76 with four, curved sidewall regions 78. Movable electrode member 74 is shown including four, flexible beam segments 80 connected between four anchor posts 82 that remain connected to the bulk silicon substrate and a central crossbeam 84 with an optionally wider section 86. The width of section 86 is selected by design to established the desired total mass of movable electrode 74 and its corresponding natural frequency of oscillation. FIG. 4B is an exploded plan view 87 of a region of crossbeam 84 that shows an array of apertures 88 formed to facilitate an etching step used to release movable member 74 from the underlying silicon substrate. In FIG. 4A, electrode structure 70 is shown for a capacitor transducer with four, variable-area capacitor elements 89 comprising a portion of curved sidewalls regions 78 and adjacent sidewall regions of flexible beams 80. It should be apparent by viewing the general design of electrode structure 70 of FIG. 4A that other electrode structures with at least one capacitor element 89 can be constructed. The total number of elements 89 can be selected in part by the desired size of the transducer and the total quiescent capacitance of a group of capacitor elements 89 electrically connected in parallel.

The profile and sidewalls of electrode members 72 and 74 and apertures 88 are formed by anisotropic, deep reactive ion etching (DRIE) through a lithographically defined etch masking layer. A thin PECVD dielectric layer 90 of silicon dioxide, nitride, or oxynitride is conformally deposited over the top surface and sidewalls of the relieved features of electrode structure 70, as well as on the floor regions and the bottom of trenches etched in the bulk silicon. A second substantially isotropic DRIE etch is performed to further etchback the silicon floor below the depth of protective dielectric layer 90 on the sidewalls of the relieved features. This etch undercuts the silicon beneath movable electrode member 74, freeing it from the silicon substrate. The undercutting of wide sections is facilitated by apertures 88. The dielectric layer 90 is then selectively removed from the surface and sidewalls of electrode structure 70 except at or near curved sidewalls regions 78 and adjacent walls of flexible beams 80. Next, a metal layer such as aluminum, or gold over chrome, is deposited to form conducting surface regions on electrode members 72 and 74 and contact sites 92 and 94 to bonded terminals 96 and 98 respectively. The metallization is restricted from regions near capacitor elements 89 and is etched from floor regions 100 and the bottom of trenches to electrically isolate electrode members 72 and 74. Terminal 96 is connected to a capacitance detection circuit and a feedback control voltage and terminal 98 shown is grounded. Alternately, the terminals can be rearranged and terminal 98 connected to ground. The feedback control voltage can include a bias or voltage offset to provide a quiescent electrostatic force to move electrode member 72 a distance $\Delta X$. The magnitude of this quiescent force determines the length l of the mutual area of surface contact between sidewall regions 78 and beams 80. The majority of the quiescent capacitance of capacitor elements 89 is proportional to length l and the permittivity of dielectric layer 90.

More specific details of DRIE silicon micromachining and the associated process steps used to fabricate transducers with parallel-plate electrode structures are taught by Galvin, et al, and described by Elwenspoek, et al., *Silicon Micromachining,* 1998, both references are incorporated herein in their entirety. Capacitive transducers with variable-area electrodes having the general shape and profile of electrode structure 70 of FIG. 4 also can be surfaced micromachined in polycrystalline silicon by sacrificial layer etching. The accelerometer of Sherman is manufactured by this method. The steps of this micromachining method are reviewed by Elwenspoek, et al.

Performance of Variable-Area Sensors and Actuators

Figure 5:
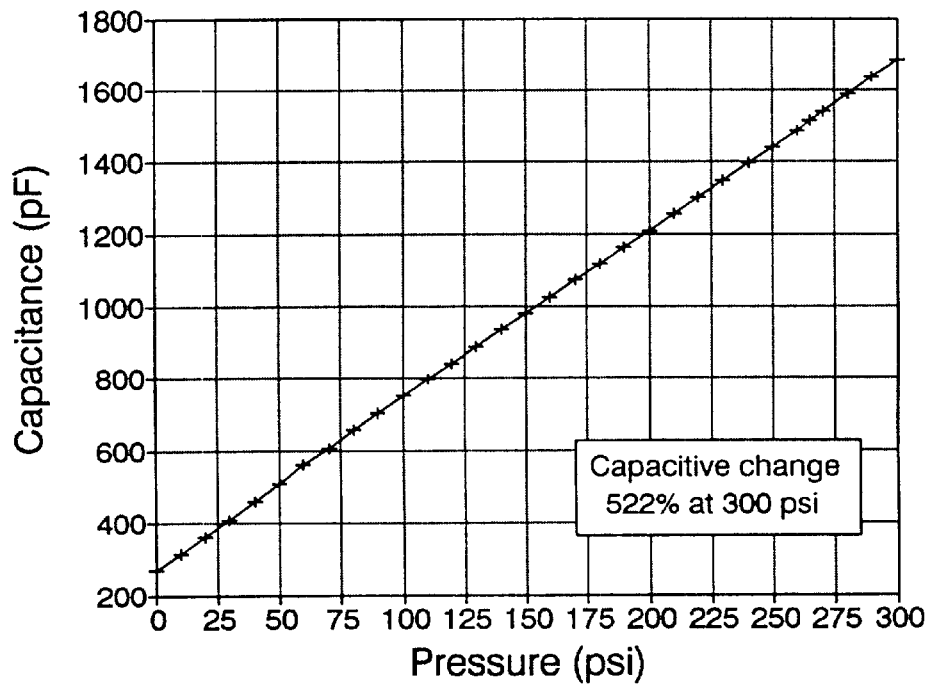
FIG. 5, is a plot of capacitance vs. pressure for a variable-area capacitor with a silicon diaphragm.
Figure 6:
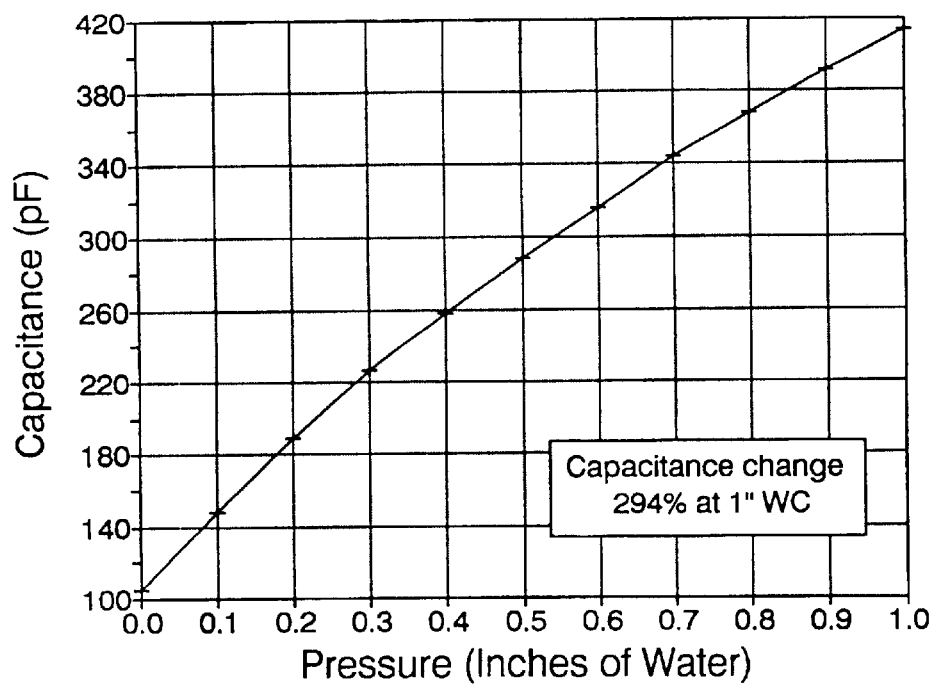
FIG. 6, is a plot of capacitance vs. pressure for a variable-area capacitor with a metallized polycarbonate diaphragm.
Figure 7:
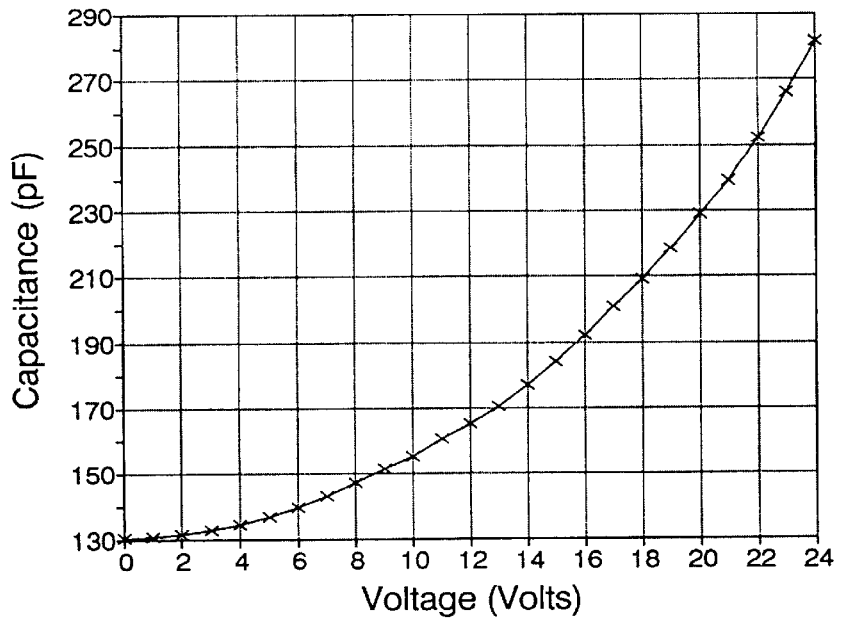
FIG. 7, is a plot of capacitance vs. voltage applied across a variable-area capacitor with a metallized polycarbonate diaphragm.

The sensitivity and dynamic range of variable-area capacitive transducers with, or without, force-balanced feedback is at least an order of magnitude higher than comparable sized transducers with parallel-plate capacitors. FIGS. 5, 6, and 7 are plots of the response of three different transducers having the general structure shown in FIG. 2. The surface contoured region of each transducer had a radius of 6.2 mm and a maximum depth of 72 microns. The overall shape of the contour is generally defined by the coordinates shown in the Table of FIG. 8A for curve 54 of FIG. 8B of U.S. Pat. No. 6,151,967. The measurement data plotted in FIGS. 5, 6, and 7 were acquired from mesoscale size transducers, but comparable response curves are realizable for micromachined transducers with electrodes having 50 micron and smaller dimensions and thinner dielectric layers.

FIG. 5, is a capacitive-pressure response curve of a pressure transducer with a 0.483-mm thick silicon diaphragm anodically bonded to a support member of Corning 7740 glass. FIG. 6, is a response curve of a pressure transducer with a 2-micron thick polycarbonate diaphragm, with a vacuum deposited aluminum film, that was thermally bonded to a polycarbonate support member with a single-point diamond machined surface counter. The less than linear response of the polycarbonate pressure sensor is a result of the generatrix of the loaded diaphragm being primarily determined by tensile stress. A different surface contour is required to obtain a more linear response when the sensing electrode is a membrane. The full-scale change in capacitance shown in FIGS. 5 and 6 exceed those of conventional capacitive sensors by a factor of 20 to 50. Capacitance changes of several thousand percent were obtained when the diaphragms were fully deflected.

FIG. 7, is a plot of capacitance as a function of voltage applied to the electrodes of a variable-area capacitance with a metallized polycarbonate diaphragm. The large capacitance change and electrode deflection of the polycarbonate transducer at low voltages demonstrates the ability to force-balance external loads over a wide dynamic range compared to prior-art transducers.

PREFERRED EMBODIMENTS

Figure 8:
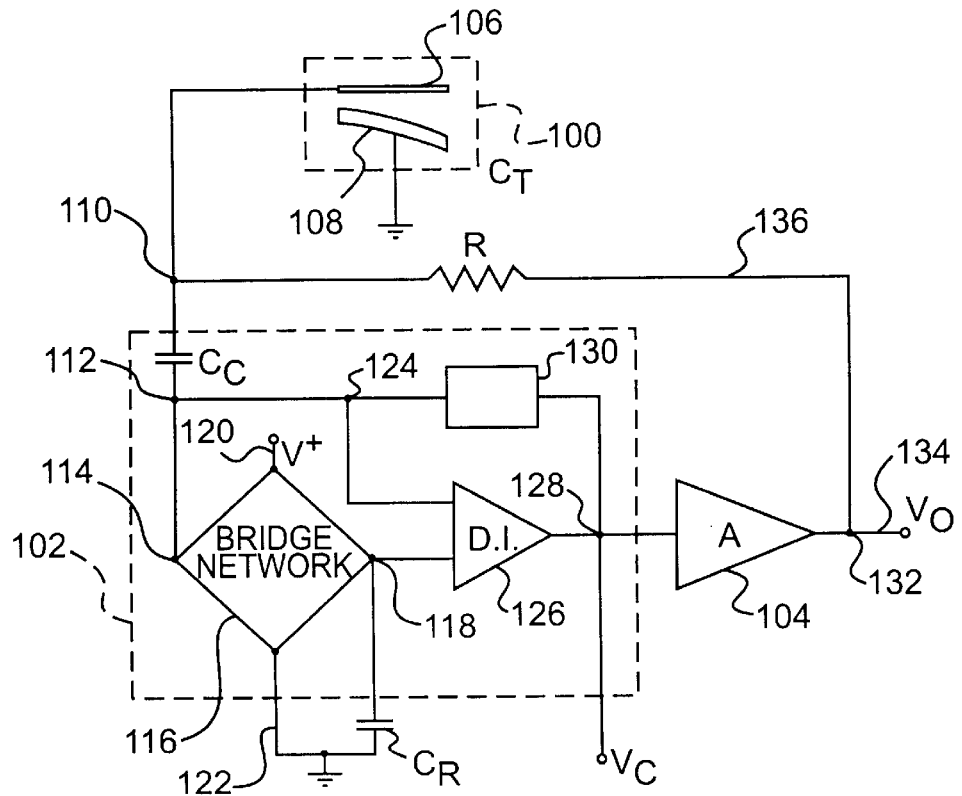
FIG. 8 is a schematic block diagram of a preferred method of the present invention to electrostatically force-balance a single-side variable-area capacitor.

FIG. 8, a simplified schematic block diagram of a preferred method of the present invention. While this invention is directed to a method to electrostatically force-balance variable-area capacitance transducers with a flexible electrode, it also provides an improved method to force-balance gap sensing capacitive transducers with substantially parallel-plate electrodes. FIG. 8 shows a variable-area capacitance transducer 100 with a quiescent capacitance value $C_T$ connected in a circuit arrangement that includes a capacitance detection circuit 102 and a high-gain amplifying means 104. Transducer 100 is shown schematically as having a flexible electrode 106 and a curved rigid electrode 108 connected to ground or another reference potential. The circuit arrangement of FIG. 8 includes two negative feedback loops. A first loop internal to capacitance detection circuit 102 feeds back current to actively null capacitance bridge network 116. An output voltage $V_C$ of circuit 102 is proportional to an incremental change between the quiescent capacitance $C_T$ of transducer 100 and a reference capacitor $C_R$. In the second feedback loop, voltage $V_C$ is amplified at high gain by amplifying means 104 to provide a feedback voltage $V_O$ to electrostatically force-balance flexible electrode 106, thereby maintaining it at a substantially fixed position of deflection. Flexible electrode 106 is connected to a common node 110 connected to a first side of a coupling capacitor $C_C$. It is preferable that the capacitance of coupling capacitor $C_C$ be at least 10 times larger than the quiescent capacitance $C_T$ of transducer 100. A second side of capacitor $C_C$ is connected to an internal node 112 connected to a first-side node 114 of actively nulled capacitor bridge network 116. A second-side node 118 of bridge network 116 is connected to reference capacitor $C_R$ returned to a ground or to said reference potential. A positive voltage $V_+$ is connected to a first terminal 120 of bridge network 116 and a second terminal 122 of bridge network 116 is connected to ground or to said reference potential. Alternately, the second-side node 118 of bridge network 116 can be directly connected (without reference capacitor $C_R$) to a reference voltage to form a half-bridge circuit arrangement with reduced measurement precision. Node 112 is also connected to internal node 124 connected to a first input of a differential integrating means 126. The second-side node 118 of bridge network 116 is connected to a second input of opposing polarity of differential integrating means 126. An output of integrating means 126 is connected to internal node 128 connected to an input of a voltage-controlled current sourcing means 130. An output of current sourcing means 130 is connected back to first-side node 114 of bridge network 116 via connections between nodes 124 and 112 to provide a feedback current to actively null a difference between the running averages of periodic voltages at first- and second-side nodes 114 and 118 of bridge network 116 respectively.

U.S. patent application Ser. No. 09/482,119, No. 09/794,198, and No. 09/816,551 teach the benefits and detailed operation of alternate embodiments of capacitor detection circuit 102. Preferably, differential integrating means includes a low-pass filter at each input to an operational amplifier with only a small-value feedback capacitor to maintain stability of the first feedback loop near the high frequency limits of the amplifier. This provides a capacitance detection circuit 102 with very high DC stability. Bridge network 116 includes a pulse generator that provides an excitation voltage waveform to periodically charge reference capacitor $C_R$ and capacitor $C_T$ through capacitor $C_C$. Accordingly, capacitors $C_R$ and $C_T$ are charged to a voltage $V^+$ during short periods of time $T_1$ and then discharged toward ground (or said reference potential) during longer periods of time $T_2$. An incremental change in capacitance between capacitor $C_T$ of transducer 100 and reference capacitor $C_R$ causes an error to develop between running averages of periodic voltage waveforms at nodes 114 and 118. This differential error signal is low-pass filtered and amplified by differential integrating means 126 to provide a voltage $V_C$ to control feedback current sourced or sinked from current sourcing means 130 to null bridge network 116 to high accuracy over a wide deflection range of flexible electrode 106. Voltage-controlled current sourcing means 130 can be a resistor, or depending upon the polarity of the input connections to differential integrating means 126, it can be an inverting voltage-controlled current source or a non-inverting voltage-controlled current conveyer. Voltage $V_C$, that is linearly proportion to a change in capacitor $C_T$, is amplified at high gain by amplifying means 104 to provide a feedback voltage $V_O$ to electrostatically force balance transducer 100 via said second feedback loop.

An input to amplifying means 104 is connected to node 128 and an output is connected to common node 132 connected to an output terminal 134. A conducting lead 136 is connected between node 132 and a resistor R connected to node 110. Resistor R, or an amplifying means with an equivalent output impedance, is required to minimize loading of the periodic voltage at node 114 by a low impedance amplifier output. Amplifying means 104 can be a high gain amplifier or an integrator with a small feedback capacitor to provide high gain at low frequencies including DC. The quiescent capacitance $C_T$ and deflection position or generatrix of flexible electrode 106 can be adjusted by applying a bias voltage to current sourcing means 130, amplifying means 104, or bridge network 116 to offset voltage $V_C$, as taught in patent application Ser. No. 09/794,198 and No. 09/816,551.

The electrostatic force $F_E$ between the plates of a capacitor varies as $\Delta V^2$, where V is an applied voltage. Accordingly, output voltage V of amplifying means 104 is proportional to the square root of the force required to force-balance transducer 100 when flexible electrode 106 deflects in response to a physical effect. The exact analytical determination of the relationship between $F_E$ and $V_F$ for large deflections of electrode 106 depends in part upon the curvature of rigid electrode 10, the geometry and material properties of electrode 106, and the properties of an intermediate fixed dielectric layer, not shown. Rakesh, et al., "Extension of the Boundary Element Method to Systems with Conductors and Piece-Wise Constant Dielectrics," *J. Microelectromech Syst.* vol. 5. September 1996, calculates the response of an electrostatically deflected actuator having the general configuration of the transducer of FIG. 1. Rakesh, et al., elected to call this device a "variable gap actuator" (VGA), a name commonly reserved for capacitive transducers with parallel-plate electrodes. The name, "variable-area capacitor" or "varying area condenser", first used by Carter, et al, more appropriately describes the fundamental electromechanical behavior of this transducer. Wang, et al., "Computation of Static Shapes and Voltages for Micromachined Deformable Mirrors with Nonlinear Electrostatic Actuators," also in *J. Microelectromech Syst.* vol. 5, September 1996, provides a general analytical approach to calculating the response of actuators with parallel-plate electrodes. This analytical approach can be generally used to calculate the response of variable-area capacitors with much less severe nonlinearities because of substantially constant electrode spacing with electrode deflection. Neither article suggests measuring the capacitance between the electrodes of an electrostatically positioned actuator to provide a feedback voltage for closed-loop, electrostatic control of a movable or deformable electrode.

The method of the present invention can be practiced using prior art capacitive detection circuits, amplifying means, and gap varying capacitors with substantially parallel-plate electrodes before deflection of a compliant electrode in response to a force or pressure.

Figure 9:
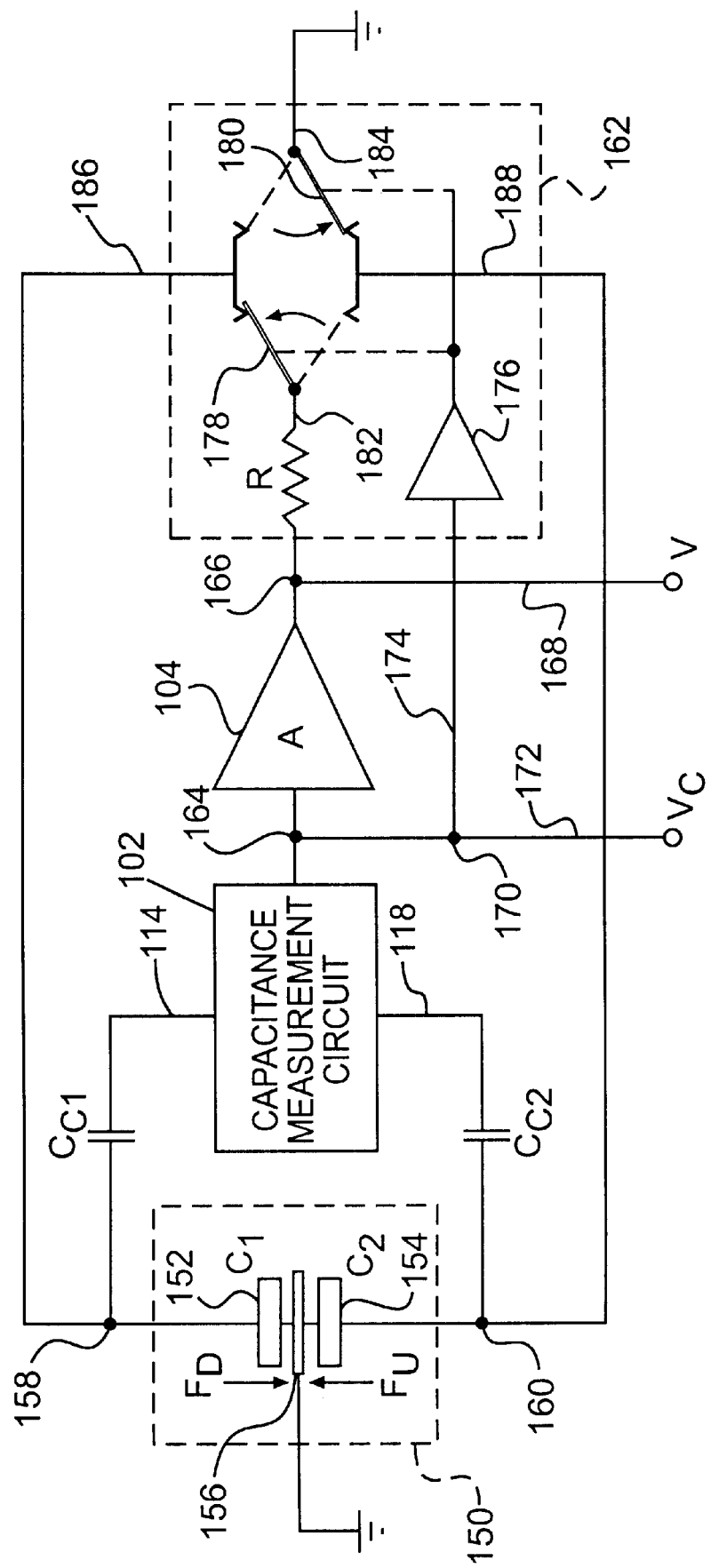
FIG. 9 is a schematic block diagram of a preferred method of the present invention to electrostatically force-balance a differential variable-area capacitor.

FIG. 9 is a schematic block diagram of a preferred method of the present invention to electrostatically force-balance a differential capacitive transducer 150. Transducer 150 comprises two differential capacitor elements $C_1$ and $C_2$ with stationary electrodes 152 and 154 respectively located on opposing sides of a common flexible or movable cooperating electrode 156 connected to ground or another reference potential. As electrode 156 moves in response to an applied force or stress, the capacitance of one capacitor element ($C_1$ or $C_2$) will increase and the capacitance of the second capacitor element ($C_2$ or $C_1$) will decrease substantially by the same amount. Stationary electrode 152 is connected to node 158 that is connected to a first side of a first coupling capacitor $C_{C1}$ and stationary electrode 154 is connected to node 160 that is connected to a first side of a second coupling capacitor $C_{C2}$. A second side of capacitors $C_{C1}$ and $C_{C2}$ is connected to terminals 114 and 118 of a capacitance detection circuit 102 respectively. Referring to FIG. 8, it can be seen that reference capacitor $C_R$ connected to capacitive detection circuit 102 is replaced in the circuit arrangement of FIG. 9 by capacitor element $C_2$ electrically connected in series with second coupling capacitor $C_{C2}$. Coupling capacitor $C_{C2}$ allows the value of capacitor element $C_2$ to be differentially sensed with respect to capacitor element $C_1$. Flexible electrode 156 is maintained at a neutral position at which the net physical and electrostatic forces acting on electrode 156 are substantially zero. Since the electrostatic force $F_E$ on the electrodes of a capacitor with a voltage V is proportional to $V^2$, a force of attraction will be created by a voltage of either polarity. Accordingly, to maintain flexible electrode 156 at a fixed position of deflection or displacement, it is necessary to use a feedback steering means 162 to apply feedback voltage V to the appropriate electrode 152 or 154 to provide a downward acting electrostatic force $F_D$ or an upward acting electrostatic force $F_U$ as required to maintain flexible electrode 156 at a fixed position. A output of circuit 102 is connected to a common node 164 connected to an input of a high-gain amplifying means 104 with an output connected to common node 166 connected to output terminal 168. Node 164 is also connected to a common node 170 connected to output terminal 172 and to an input terminal 174 of a voltage comparator 176 of feedback steering means 162. Feedback steering means 162 is shown representatively as comprising comparator 176 that controls the position of two, CMOS single-pole double-throw switches (SPDT) 178 and 180 as a function of the polarity of voltage $V_C$ applied to terminal 174 of comparator 176. A first pole terminal 182 of switch 178 is connected to a resistor R connected node 166 and a second pole terminal 184 of switch 180 is connected to ground or said reference potential. Resistor R can be eliminated if amplifying means 104 has an equivalent driving point impedance. A first switch terminal 186 connects a first pair of an open and a closed switch contacts to node 158 and a second switch terminal 188 connects a second pair of a closed and an open pair of switch contacts to node 160. When no external forces or stresses are applied to electrode 156, it remains in a quiescent or neutral position of deflection or displacement, and voltage $V_C$ is substantially zero, whereby the output voltage V of amplifying means 104 is also zero and substantially zero feedback voltage is applied to stationary electrodes 152 or 154. Comparator 176 can incorporate positive feedback and different high and low voltage thresholds to provide hysteresis in the switching response, as in the case of a Schmitt trigger circuit. Because the product of the closed-loop gain of capacitive detection circuit 102 and the gain of amplifying means 104 is very high and also because an electrostatic force $F_E$ is dependent upon $V^2$, a small value of hysteresis, several times higher than the peak-to-peak noise of voltage V, will not significantly effect the resolution of the displacement, position, or flexure control of electrode 156.

The embodiment of the method of FIG. 9 can also be performed by other types of capacitance detection circuits, amplifying means, and feedback steering means for differential capacitive transducers with multiple variable-area or variable-gap electrodes. Transducer 150 of FIG. 9 is shown constructed with two capacitor elements with three electrodes. Many prior art differential parallel-plate capacitor transducers are constructed with independent differential capacitor elements, each with two electrodes, e.g., U.S. Pat. No. 5,540,095 of Sherman. Prior art transducers frequently used a separate pair of electrodes for force rebalancing, e.g., Cadwell, U.S. Pat. 4,584,885. Because the differential embodiment of the present invention detects capacitive changes with signals coupled through capacitors $C_{C1}$ and $C_{C2}$, a separate set of force rebalancing electrodes is not required and a common electrode to each capacitor element can be grounded, thereby only three electrodes are required for transducer 150.

The performance of certain prior art capacitive transducers that use a separate pair of force rebalancing electrodes can be improved by connecting the sensing and force capacitors in parallel. The larger parallel capacitor can more accurately sense a capacitance change and provide larger electrostatic force. Since one electrode of differential capacitor elements combined in parallel can be grounded, only three connections are required for prior art transducers formerly requiring up to eight connections.

The specific details of the embodiments described above are not intended to limit the scope of the appended claims and their legal equivalents.

What is claimed is:

1. A method to control a movable electrode of a variable capacitor by electrostatic force feedback comprising the steps of:
    a. providing a capacitor with a movable electrode and a cooperating stationary electrode;
    b. providing a capacitance detection circuit with an input coupling capacitor electrically connected to one said capacitor electrode;
    c. detecting and amplifying a change in capacitance of said variable capacitor to generate a feedback control voltage;
    d. applying said feedback control voltage across said movable and said stationary electrodes, whereby said movable electrode is maintained at a fixed position or predetermined generatrix.

2. The method as claimed in claim 1 wherein said capacitor is a variable-area capacitor.

3. The method as claimed in claim 1 wherein said capacitor is a capacitive transducer.

4. The method as claimed in claim 1 wherein said movable electrode is connected to a ground potential.

5. The method as claimed in claim 1 wherein said stationary electrode is connected to a ground potential.

6. The method as claimed in claim 1 wherein said capacitor at least in part is bulk micromachined.

7. The method as claimed in claim 1 wherein said capacitor at least in part is surface micromachined.

8. A method to control by electrostatic force feedback a moveable electrode located between two cooperating capacitor electrodes that form a first and a second capacitor element of a differential capacitor comprising the steps of:
    a. providing a differential capacitor with a movable electrode and two stationary electrodes;
    b. providing a capacitance detection circuit that includes two input coupling capacitors and a bridge network means actively nulled by current feedback;
    c. providing an amplifying means with an output connected to a beam steering means;
    d. differentially detecting and amplifying a capacitance change of said first and said second capacitor elements to generate an error signal proportional to said capacitance change;

e. amplifying said error signal to provide a feedback control voltage and steering said control voltage to one said capacitor element.

9. The method as claimed in claim 8 wherein said capacitor is a differential variable-area capacitor.

10. The method as claimed in claim 8 wherein said capacitor is a differential capacitive transducer.

11. The method as claimed in claim 8 wherein said movable electrode of said differential capacitor is connected to a ground potential.

12. The method as claimed in claim 8 wherein said capacitor at least in part is bulk micromachined.

13. The method as claimed in claim 8 wherein said capacitor at least in part is surface micromachined.

14. An electrostatically force-balanced capacitive transducer comprising:
   a. a variable capacitor with a first electrode connected to a ground potential and a second electrode connected to a coupling capacitor connected to a first-side node of a bridge network means actively nulled by current feedback;
   b. said first-side node connected to a first input of a differential integrating means and a second-side node of said bridge network connected to a second input of opposing polarity of said integrating means and an output of said integrating means connected to a voltage-controlled current sourcing means connected to said first-side node of said bridge network means, whereby a first negative feedback loop actively nulls said bridge network means;
   c. said output of said integrating means connected to an input of an amplifying means with finite output impedance connected to said second electrode of said transducer, thereby a second negative feedback loop electrostatically force-balances said capacitive transducer.

15. The electrostatically force-balanced capacitive transducer of claim 14 further including a reference capacitor connected between said second-side node of said bridge network means and said ground potential, thereby forming a balanced full-bridge network.

16. The electrostatically force-balanced capacitive transducer of claim 14 further including a third electrode of said transducer connected to a second coupling capacitor connected to said second-side node of said bridge network means and said amplifying means connected to a feedback steering means with a first output terminal connected to said second capacitor electrode and a second output connected to said third capacitor electrode, thereby forming a differential electrostatically force balanced capacitive transducer.

* * * * *